(12) United States Patent
Hosoda et al.

(10) Patent No.: US 6,551,896 B2
(45) Date of Patent: Apr. 22, 2003

(54) CAPACITOR FOR ANALOG CIRCUIT, AND MANUFACTURING METHOD THEREOF

(75) Inventors: Keizo Hosoda, Ibaraki (JP); Yusuke Muraki, Yamanashi (JP); Atsushi Sato, Tokyo (JP); Harunori Ushikawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/913,768

(22) PCT Filed: Dec. 13, 2000

(86) PCT No.: PCT/JP00/08792

§ 371 (c)(1),
(2), (4) Date: Aug. 16, 2001

(87) PCT Pub. No.: WO01/45177

PCT Pub. Date: Jun. 21, 2001

(65) Prior Publication Data

US 2002/0160577 A1 Oct. 31, 2002

(30) Foreign Application Priority Data

Dec. 17, 1999 (JP) ............................................. 11-358701

(51) Int. Cl.[7] ................................................ H01L 29/94
(52) U.S. Cl. ........................ 438/396; 257/306; 257/310
(58) Field of Search .......................... 438/396; 257/306, 257/310

(56) References Cited

U.S. PATENT DOCUMENTS

| | | |
|---|---|---|
| 5,478,765 A | 12/1995 | Kwong et al. |
| 5,985,730 A | 11/1999 | Lim |
| 6,201,276 B1 * | 3/2001 | Agarwal et al. ............. 257/315 |
| 6,323,098 B1 * | 11/2001 | Ogata et al. ................. 438/396 |

FOREIGN PATENT DOCUMENTS

| | | |
|---|---|---|
| EP | 0 046 868 A2 | 3/1982 |
| JP | 10321801 | 12/1998 |

* cited by examiner

Primary Examiner—Richard Elms
Assistant Examiner—Beth E. Owens
(74) Attorney, Agent, or Firm—Crowell & Moring LLP

(57) ABSTRACT

Rapid thermal nitridation is carried out to form a nitride film on a lower electrode which is made of silicon, and a tantalum oxide dielectric film is further formed thereon. Then, wet oxidization is carried out to oxidize the lower electrode through the dielectric film and the nitride film, thus an oxide film is formed between the lower electrode and the nitride film. Further, silicon which is not bonded to nitrogen in the nitride film is oxidized, thus an oxide film whose effective thickness is equal to or greater than 2 nm. The oxidization also recrystallizes the dielectric film. Finally, an upper electrode is formed, and the capacitor is completed.

17 Claims, 9 Drawing Sheets

CAPACITOR FOR ANALOG CIRCUIT, AND MANUFACTURING METHOD THEREOF

BACKGROUND OF THE INVENTION

The present invention relates to a capacitor applicable to a semiconductor integrated circuit and a manufacturing method of the capacitor. Especially, the capacitor according to the present invention is a capacitor having large capacity and high voltage resistance, thus being suitable for an analog circuit.

One of known capacitors used for a semiconductor device is a capacitor for DRAM (Dynamic Random Access Memory).

Recent design rule to be applied to the DRAM is given in sub micrometers, and required operation voltage has been reduced down to approximately 1.1V. That is, DRAM has required larger scaled integration and lower operation voltage. To overcome those technical difficulties, various structures and manufacturing methods have been proposed.

For example, Unexamined Japanese Patent Application KOKAI Publication No. H9-121035 discloses a method for manufacturing a capacitor. According to the disclosed technique, a capacitor is manufactured by the following steps. A lower electrode (storage electrode) is formed first, and tantalum oxide is deposited onto the lower electrode. Then, the wafer is annealed under an oxygen atmosphere, thus, oxygen vacancy in the tantalum oxide is removed while the tantalum oxygen is recrystallized. After performing the deposition and crystallization of the tantalum oxide several times, an upper electrode (common electrode) is formed, thus the fabrication of the capacitor is completed.

Unexamined Japanese Patent Application KOKAI Publication No. H10-74898 also discloses a method for manufacturing a capacitor. According to the method, a capacitor is manufactured by the following steps. A lower electrode made of polysilicon is formed first. The surface of the lower electrode is subjected to rapid thermal nitridation and rapid thermal oxidation, and then tantalum oxide is deposited onto the surface. The wafer is annealed under an oxygen atmosphere to remove oxygen shortage while recrystallizing the tantalum oxide. An anti-diffusion film made of titanium nitride or the like is formed on the surface. Finally, an upper electrode is formed thus the fabrication of the capacitor is completed.

Another method disclosed in Unexamined Japanese Patent Application KOKAI Publication No. H11-135756 teaches the following steps for manufacturing a capacitor. A lower electrode made of doped polysilicon is formed first. Then, the lower electrode is nitrided, and tantalum oxide is deposited onto the nitrided lower electrode. The wafer is annealed under an oxide atmosphere, and wet oxidization and dry oxidization are carried out to crystallize the tantalum oxide. An anti-diffusion film made of titanium nitride or the like is formed on the surface. Finally, an upper electrode is formed, thus, the fabrication of the capacitor is completed. According to this method, the nitride film acts as a barrier film for oxidization during the wet and dry oxidation steps, thus, the lower electrode is prevented from being oxidized.

Other than DRAM, the capacitors are useful for analog circuits such as an audio circuit, an RF (Radio Frequency) circuit and a power supply circuit. In the field of the analog circuits, capacitors having large capacitance are necessary for driving the circuits with an operation voltage in a range of 3.3 to 15 V or higher. The above described techniques for fabricating capacitors are not suitable for manufacturing the capacitors having large capacitance and excellent high voltage resistance. For example, maximum allowable voltage for a tantalum oxide film whose thickness is suitable for DRAM is only approximately 1.2 V. This is caused by a tunnel current which influences greatly as higher voltage is applied. Thicker tantalum oxide film merely raises the allowable voltage up to approximately 3 V. This is caused by oxygen vacancies remaining in the tantalum oxide film even if the tantalum oxide film has been oxidized and crystallized. Further, the thicker the tantalum oxide film becomes, the easier the vacancies appears. Therefore, it is difficult to form a thick tantalum oxide film without oxygen vacancies in the case of an analog circuit which requires a thick tantalum film.

In consideration of the above, a capacitor having large capacitance and excellent high voltage resistance with using a dielectric film and a method of manufacturing such a capacitor have been required.

SUMMARY OF THE INVENTION

The present invention was made in consideration of the above, it is an object of the present invention to provide a capacitor having large capacitance and excellent high voltage resistance, and a method for manufacturing the capacitor.

It is another object of the present invention to provide a proper capacitor suitable for an analog circuit, and a method for manufacturing the capacitor.

It is still another object of the present invention to provide a large capacitance capacitor which uses a dielectric film to withstand 3.3 V or more for an analog circuit, and a method for manufacturing the capacitor.

A method for manufacturing a capacitor for an analog circuit comprises the steps of:

forming a semiconductor layer (15) to be a first electrode;

forming a dielectric film (23) on the semiconductor layer (15);

oxidizing the semiconductor layer (15) via the dielectric film (23) to form an oxide film between the semiconductor layer (15) and the dielectric film (23); and forming a second electrode (25) on the dielectric film (23) so as to face the first electrode (15).

DETAILED DESCRIPTION OF THE PREFERRED EMBODIMENTS

A capacitor and a method for manufacturing the capacitor according to an embodiment of the present invention will now be described with reference to FIGS. 1 to 12.

Figure 1:
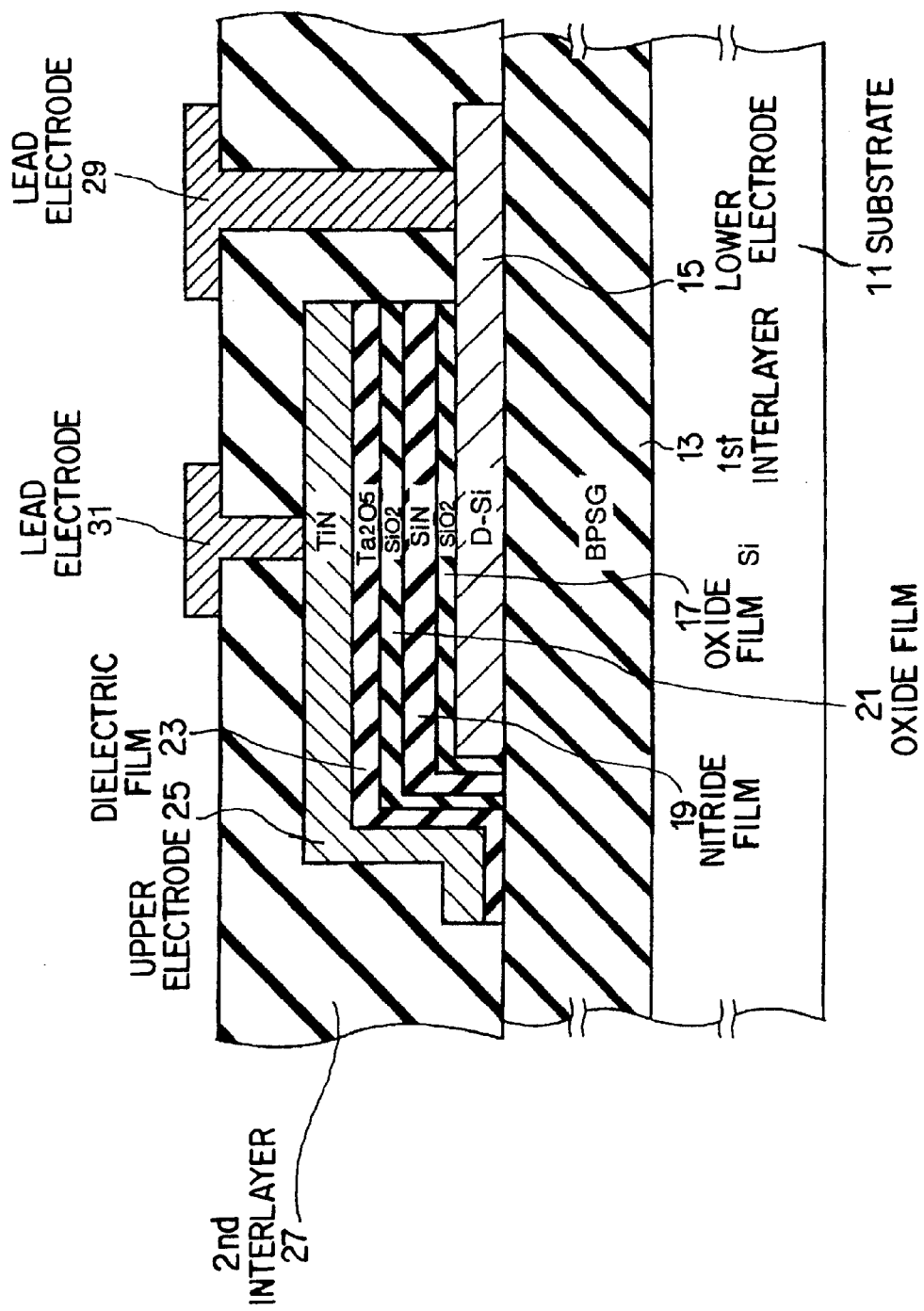
FIG. 1 is a cross sectional view showing the structure of a capacitor according to an embodiment of the present invention.

FIG. 1 is a cross sectional view showing the structure of the capacitor according to the embodiment of the present invention.

As shown in FIG. 1, the capacitor comprises a semiconductor substrate 11, a first interlayer film 13 formed on the semiconductor substrate 11, a lower electrode 15 formed on the first interlayer film 13, an oxide film 17 formed on the lower electrode 15, a nitride film 19 formed on the oxide film 17, another oxide film 21 formed on the nitride film 19, a dielectric film 23 formed on the oxide film 21, an upper electrode 25 formed on the dielectric film 23, a second interlayer film 27, and lead electrodes 29 and 31 connected to the lower electrode 15 and the upper electrode 25 respectively.

The semiconductor substrate 11 is made of, for example, a monocrystalline silicon on which a plurality of diffusion regions are formed.

The first interlayer film 13 is, for example, an insulation film such as a BPSG (Boro-Phospho Silicate Glass). The interlayer film 13 insulates the semiconductor substrate 11 from the circuit structure formed thereon, and flattens the surface of the semiconductor substrate 11.

The lower electrode 15 is formed on the first interlayer film 13, and is made of a doped-polysilicon (D-Si) film in which p- or n-type impurity such as phosphorus is doped.

The oxide film 17 is formed over the surface of the lower electrode 15 by wet oxidization via the dielectric film 23 and the nitride film 19.

The nitride film 19 is a silicon nitride film having a thickness of 0.5 to 2.0 nm which is formed by nitridating the lower electrode 15 with, for example, RTN (Rapid Thermal Nitridation) under nitride atmosphere such as nitrogen and ammonium. The nitride film 19 insulates the lower electrode 15 from the upper electrode 25 to prevent chemical reaction caused by direct contact between the lower electrode 15 and the dielectric layer 23, and to restrict impurity diffusion into the lower electrode 15.

The oxide film 21 is formed by wet oxidization applied to the surface of the nitride film 19 via the dielectric film 23.

The thickness of the oxide films 17 and 21 is set so that the sum of the thickness of the oxide films 17, 21 and the thickness of a virtual oxide film whose high voltage resistance is the same as that of said nitride film 19 having the thickness described above, is 2 nm or thicker.

The dielectric film 23 is a tantalum oxide ($Ta_2O_5$) film having a thickness of, for example, approximately 15 to 60 nm (more preferably, 30 to 50 nm), which has a higher dielectric constant than those of the oxide films and the nitride film. Such a dielectric film 23 is helpful for producing a capacitor having large capacitance.

The upper electrode 25 is made of a titanium nitride (TiN) film whose thickness is approximately 70 to 120 nm. The upper electrode 25 forms a pair of opposite electrodes with the lower electrode 15.

The second interlayer film 27 is made of a silicon oxide film, and protects the whole capacitor.

The lead electrodes 29 and 31 are connected to the lower electrode 15 and the upper electrode 25 respectively, and those act as extensions of the lower electrode 15 and the upper electrode 25 being led to the surface of the second interlayer film 27.

Steps for manufacturing thus structured capacitor will now be described.

Figure 2A:
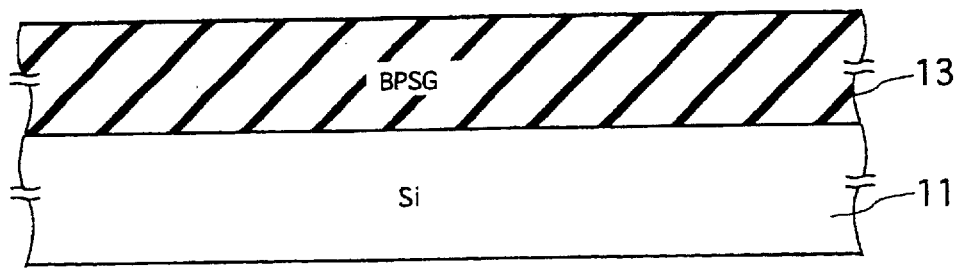
FIGS. 2A and 2B are diagrams for explaining manufacturing process of the capacitor shown in FIG. 1.

Atmospheric pressure thermal CVD (Chemical Vapor Deposition) or the like is carried out to deposit BPSG (Boro-Phospho Silicate Glass) onto the semiconductor substrate 11 on which desired circuit elements (diffusion layer etc.) have been formed, to form the first interlayer film 13 as shown in FIG. 2A.

Figure 2B:
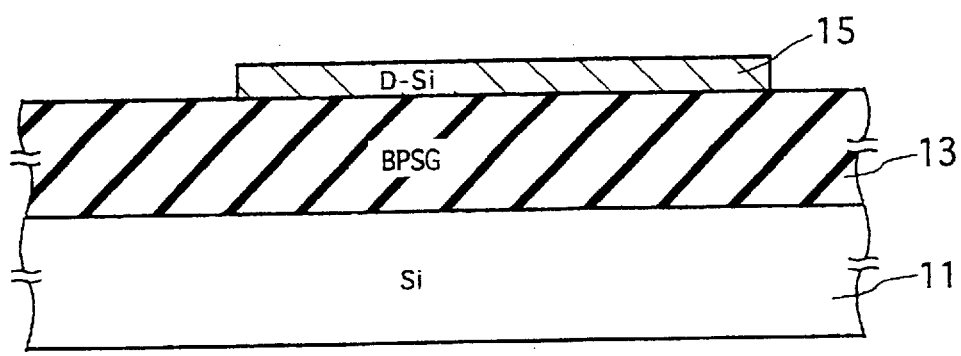

After the first interlayer film 13 is formed, low-pressure CVD or the like is carried out to deposit doped-polysilicon (D-Si) in which an impurity such as phosphorus (P) is doped, onto the first interlayer film 13. The formed polysilicon film is patterned to form the lower electrode 15 as shown in FIG. 2B.

Figure 3A:
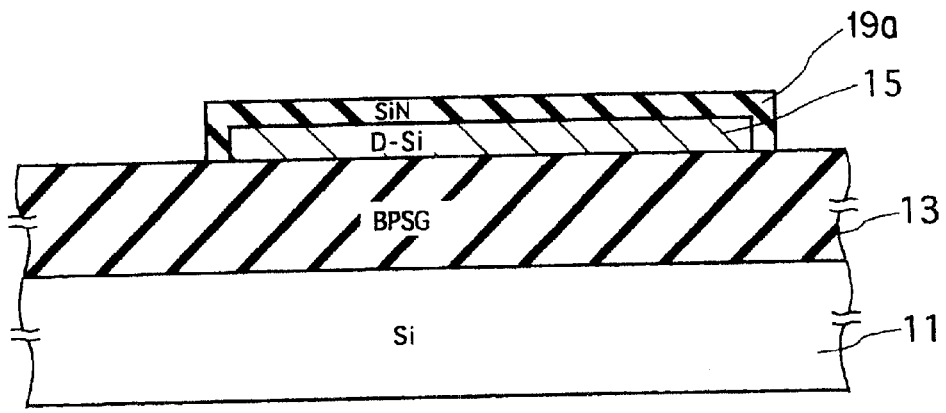
FIGS. 3A and 3B are diagrams for explaining manufacturing process of the capacitor shown in FIG. 1.

The surface of the lower electrode 15 is nitrided so that a silicon nitride ($Si_3N_4$) layer 19a having a thickness of approximately 1.5 to 2.5 nm (more preferably, around 2 nm) is formed as shown in FIG. 3A. For example, a batch type rapid thermal nitridation apparatus applies nitriding over the surface of the lower electrode 15 to form the silicon nitride film 19a. During the nitriding process, for example, the wafer is rapidly heated up to approximately 750 to 850 degrees Celsius (more preferably, around 800 degrees Celsius) with 2,000 sccm of ammonia gas ($NH_3$) under reduced pressure of 16 KPa (120 Torr), keeping the condition for 40 to 80 minutes (more preferably, around 60 minutes).

Figure 3B:
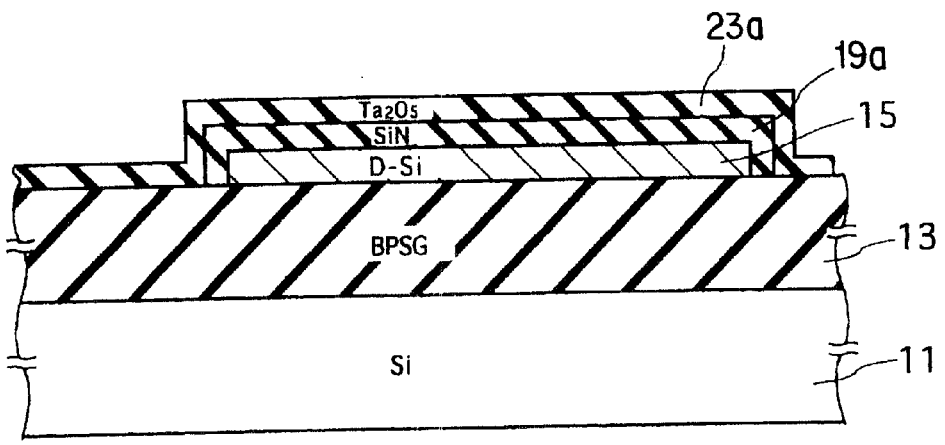
Figure 6:
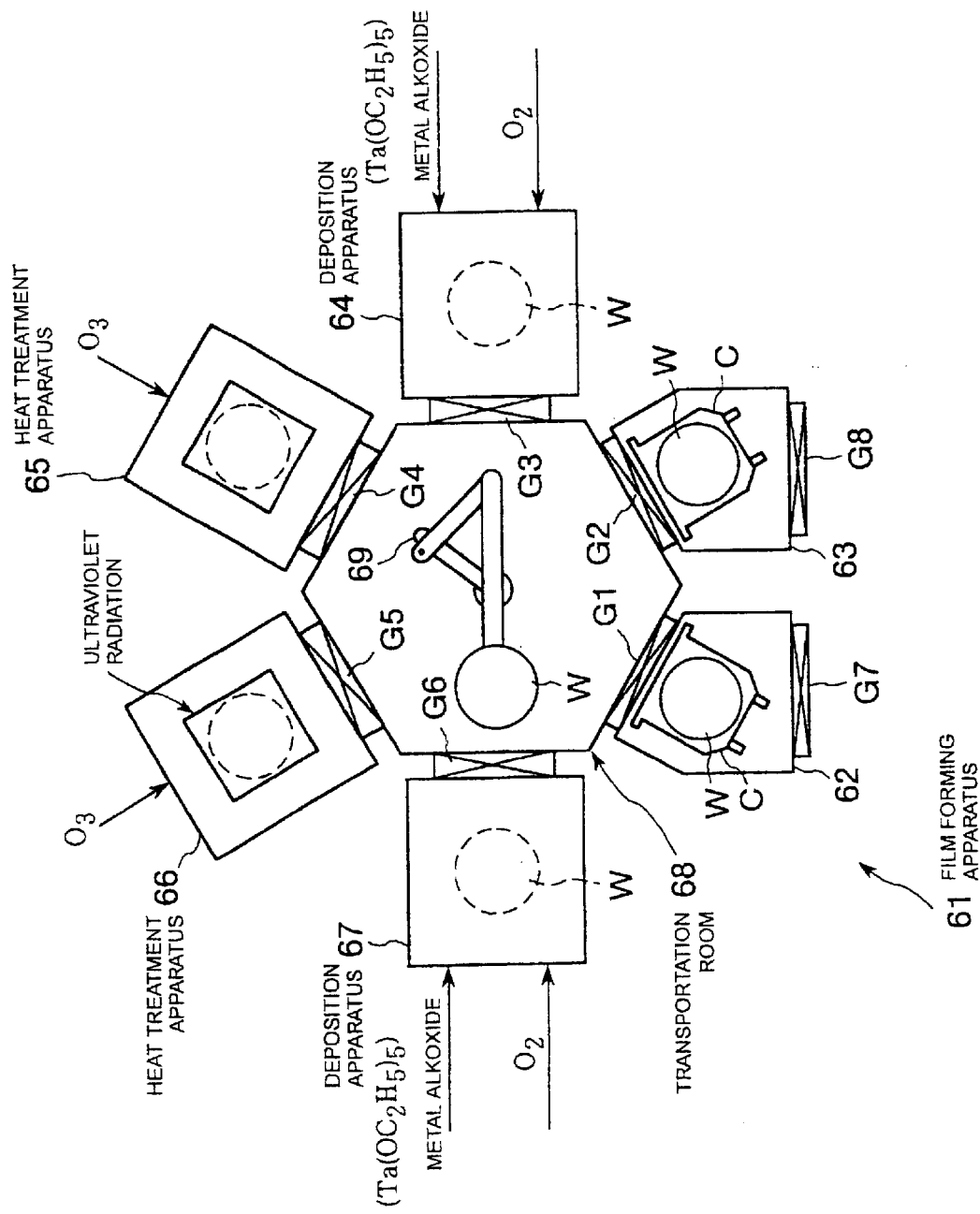
FIG. 6 is a diagram showing the structure of an apparatus for forming a metal oxide film.

Then, using a metal oxide film forming apparatus 61 shown in FIG. 6, a tantalum oxide film 23a is formed on the wafer on which the silicon nitride film 19a is formed, as shown in FIG. 3B.

The metal oxide film forming apparatus 61 comprises, as shown in FIG. 6, cassette chambers 62 and 63, deposition apparatuses 64 and 67, heat treatment apparatuses 65 and 66, and a transportation room 68, and all of which are clustered.

The cassette chambers 62 and 63, having gates G7 and G8, can hold cassettes C each can hold a bunch of semiconductor wafers.

Both the deposition apparatuses 64 and 67 form amorphous metal oxide films such as amorphous tantalum oxide films. The deposition apparatuses 64 and 67 form film with the thermal CVD technique which employs a mixture of a supplied gas after bubbling liquid metal alkoxide, such as tantalum pentaethoxide ($Ta(OC_2H_5)_5$) and an oxide gas such as $O_2$, to carry out film forming. The dual former structure is helpful to improve throughput.

The heat treatment apparatuses 65 and 66 expose the amorphous metal oxide layer to active oxygen atoms to modify the metal oxide layer. The heat treatment apparatus performs the modification process and the crystallization process selectively or simultaneously. During the modification process, the heat treatment apparatuses 65 and 66 expose the surface of the wafer which is placed on a stage having a built-in heater to active oxygen atoms, thus the metal oxide film on the surface of the wafer is modified. During the crystallization process, the modified metal oxide film is crystallized. Ozone ($O_3$) introduced to the heat treatment apparatuses 65 and 66 or generated therein may be suitable for the modification process as the active oxygen atoms.

The transportation room 68 communicates with the cassette chamber 62 and 63, the deposition apparatuses 64 and 67, and the heat treatment apparatuses 65 and 66 through gates G1 to G6. The transportation room 68 is equipped with a flexible multi-joint arm 69 which rotates, expands and squeeze to transport the wafer.

Thus structured cassette chambers 62 and 63, and the deposition apparatuses 64 and 67 are equipped with gas introducing systems which introduce inert gas such as $N_2$ gas into them, and with vacuum systems which vacuum them. Those systems are controlled individually.

Process for forming a tantalum oxide film using the above described metal oxide film forming apparatus 61 will now be described.

First, a cassette C holding a plurality of wafers W each of which in the state shown in FIG. 3A, is loaded into the cassette chamber 62. Then the chamber 62 is filled with $N_2$ gas after the gate G7 is closed, and the chamber 62 is evacuated.

The arm 69 picks up one of the wafers W from the cassette C through opened gate G1, and takes it into the transportation room 68 which has been evacuated.

Then, the wafer W is loaded into the deposition apparatus 67 which has been evacuated, through the gate G6.

After the wafer W is loaded in the deposition apparatus 67, liquid metal alkoxide $Ta(OC_2H_5)_5$ is introduced into the deposition apparatus 67 with bubbling by He gas, and an oxide gas such as $O_2$ is also introduced therein. The supply rate of the metal alkoxide is, for example, merely several mg/min. For this process, the process pressure is around 26 to 39 Pa (0.2 to 0.3 Torr), and the process temperature is 250 to 450 degrees Celsius.

According to this process, tantalum oxide is deposited onto the semiconductor substrate 11, thus the tantalum oxide film 23a is formed. Since an organic material is used in this process, the tantalum oxide film 23a must be contaminated with organic impurities. And the tantalum oxide film 23a is kept amorphous.

After the film formation process, the arm 69 picks up the wafer W from the deposition apparatus 67, and loads it into the heat treatment apparatus 66 which has been evacuated through opened gate G5. The wafer W is a subjected to modification process for modifying the amorphous tantalum oxide film 23a.

In the modification process, ultraviolet radiation is irradiated onto the wafer W as ozone is introduced into the heat treatment apparatus 66. The ozone is activated by the ultraviolet radiation, thus a mass of active oxygen atoms are generated. Those active oxygen atoms oxidize the organic impurities in the tantalum oxide film 23a on the wafer surface. Further, bonding between carbon atoms and the like are cleaved by the energy of the ultraviolet radiation. As a result, the organic impurities are removed from the tantalum oxide film 23a. Preferable conditions for the modification process are: ultraviolet radiation having, for example, wavelengths of 185 nm and 254 nm; the process pressure around 133 Pa to 80 kPa (1 to 600 Torr); and the process temperature in a range of, for example, 320 to 700 degrees Celsius which is lower than 700 degrees Celsius, crystallization temperature of tantalum oxide. If the process temperature is lower than 320 degrees Celsius, the electric strength is not enough. Or, if the process temperature exceeds 700 degrees Celsius, crystallization of the tantalum oxide film 23a obstructs the modification.

After the modification process of the tantalum oxide film 23a, the arm 69 picks up the wafer W from the heat treatment apparatus 66, and sets it on the cassette C in the second cassette chamber 63.

After the above processing has been done for all wafers W in the cassette C, the cassette C is unloaded from the second cassette chamber 63.

Figure 7:
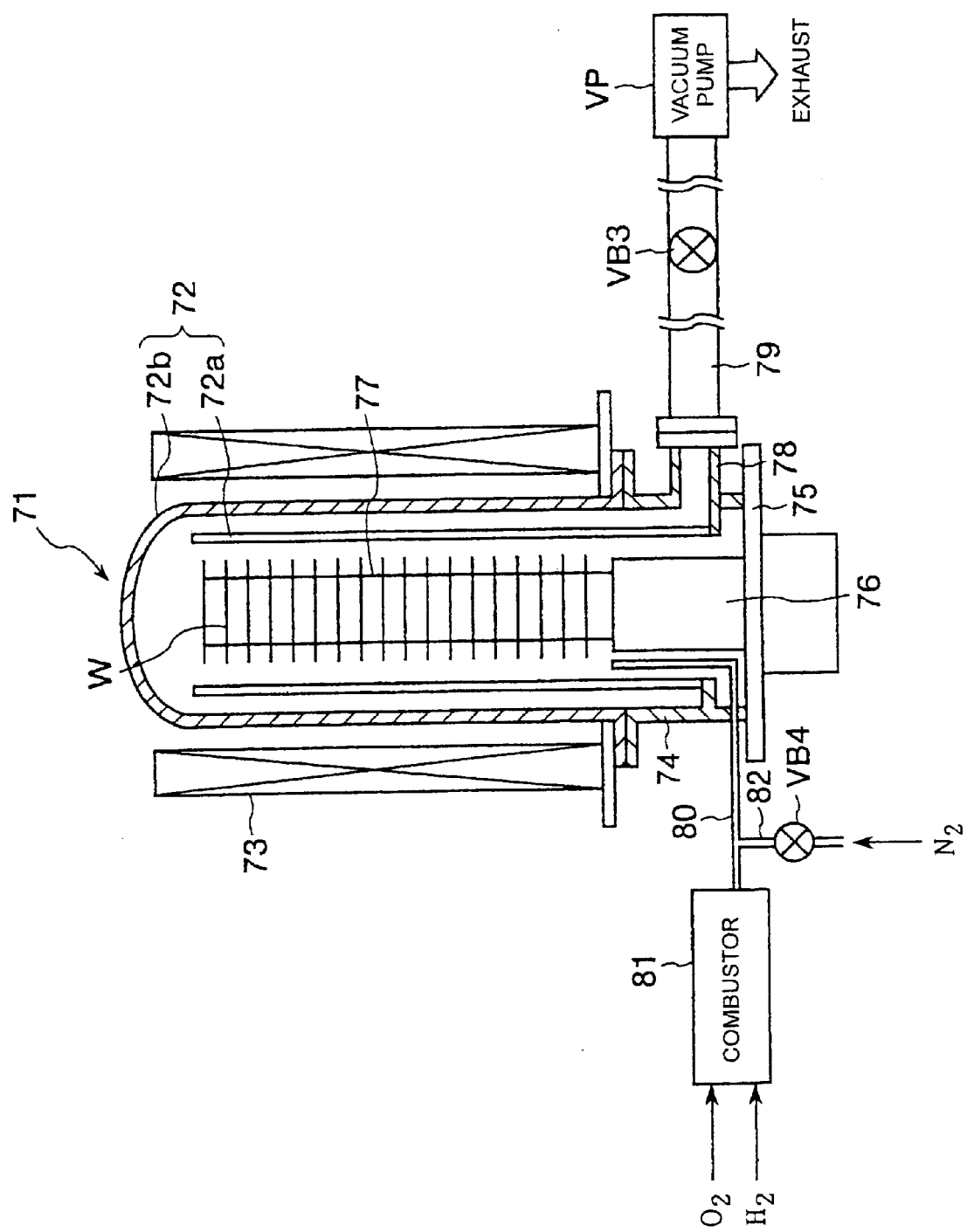
FIG. 7 is a diagram showing the structure of an apparatus for wet oxidation.

Then, wet oxidization is carried out with using a wet oxidization apparatus 71 shown in FIG. 7, after the formation of the tantalum oxide film 23a is completed.

The wet oxidization apparatus 71 shown in FIG. 7 comprises a reaction tube 72 having dual-tube structure includes an inner tube 72a and a roofed outer tube 72b being arranged concentrically.

The wet oxidization apparatus 71 is equipped with a heater 73 around the reaction tube 72.

A manifold 74 is hermetically connected to the reaction tube 72 at the bottom of the outer tube 72b. The manifold 74 is made of stainless steel, and has an opening at its bottom.

A plurality of gas supplying tubes 80 are arranged in the circumference direction of the manifold 74. A combustor 81 is connected to one of the gas supplying tubes 80 as shown in FIG. 7. The combustor 81 generates vapor by combustion reaction (or catalysis) between $H_2$ gas and $O_2$ gas.

An inert gas supplying tube 82 is connected to the gas supplying tube 80 connected to the combustor 81. The inert gas supplying tube 82 is equipped with a valve VB4, and inert gas such as $N_2$ gas is supplied through the valve VB4 and the inert gas supplying tube 82 in order to dilute the generated vapor.

The bottom opening of the manifold 74 is hermetically covered with a lid 75. A heat insulator 76 stands on the lid 75, which holds a wafer boat 77 thereon. A boat elevator (not shown) elevates the lid 75.

The manifold 74 has an exhaust port 78 which is connected to an exhaust pipe 79 leading to a vacuum pump VP via a valve VB3.

As a first step for oxidization by the wet oxidization apparatus 71, a wafer boat on which the wafers W in the state shown in FIG. 3B is loaded into the reaction tube 72, and closing the opening of the manifold 74 by the lid 75.

Then, the inside of the reaction tube 72 is heated so that the temperature raises up to, for example, 850 degrees Celsius at heating rate of 100 degrees Celsius/min.

When the temperature inside the reaction tube 72 reaches the processing temperature of 850 degrees Celsius, the pressure inside the reaction tube 72 is controlled so that the pressure is, for example, approximately 5 mm $H_2O$ to 10 mm $H_2O$ under atmospheric pressure. Under this condition, a recovery process is carried out in order to keep the temperature of the wafers W constant.

Then, $H_2$ gas and $O_2$ gas are introduced into the combustor 81 to combust them, and supply generated vapor to the reaction tube 72 with diluting the vapor by $N_2$ gas supplied through opened valve VB4.

The oxidization with vapor, that is, wet oxidization is advantageous over other oxidization techniques such as dry oxidization, because the target is oxidized very deeply. In this case, not only unnitrided silicon atoms in the silicon nitride film 19a are oxidized via the tantalum oxide film 23a, but also the surface of the lower electrode 15 and the surface of the silicon nitride film 19a are oxidized. As a result, a thin silicon oxide film 17a is formed between the lower electrode 15 and the silicon nitride film 19a (in other words, on the surface of the lower electrode 15), and another thin silicon oxide film 21a is formed between the silicon nitride film 19a and the tantalum oxide film 23a. Further, the silicon nitride film 19a is changed completely or partially to an oxidation film.

During the oxidation process, oxygen vacancy caused by oxygen shortage is diminished, and the tantalum oxide film 23a is recrystallized.

The oxidation process is carried out, so that effective thickness of the oxide film between the lower electrode 15 and the tantalum oxide film 23a is equal to or greater than 2 nm. In other words, the process is carried out, so that the sum of the thickness of the silicon oxide films 17a, 21a and the thickness of a virtual oxide film whose high voltage resistance is the same as that of the silicon nitride film 19a, is 2 nm or thicker. However, if the thickness of the oxide film is extremely large, the capacity of the capacitor will be smaller than expected because the oxide film has a low dielectric constant. The effective thickness of the oxide film is approximately 2 to 4 nm (preferably, around 2 to 3 nm) while being ½ of the thickness of the tantalum oxide film 23a or less (preferably, ⅒ thereof or less).

As the oxidation process is completed, the supply of $H_2$ gas and $O_2$ gas to the combustor 81 is stopped, and the valve VB4 is opened to compress the reaction tube 72 with nitrogen gas up to atmospheric pressure for cooling the reaction tube 72 for a predetermined time period. Then, the wafer boat 77 is unloaded from the reaction tube 72.

Figure 4A:
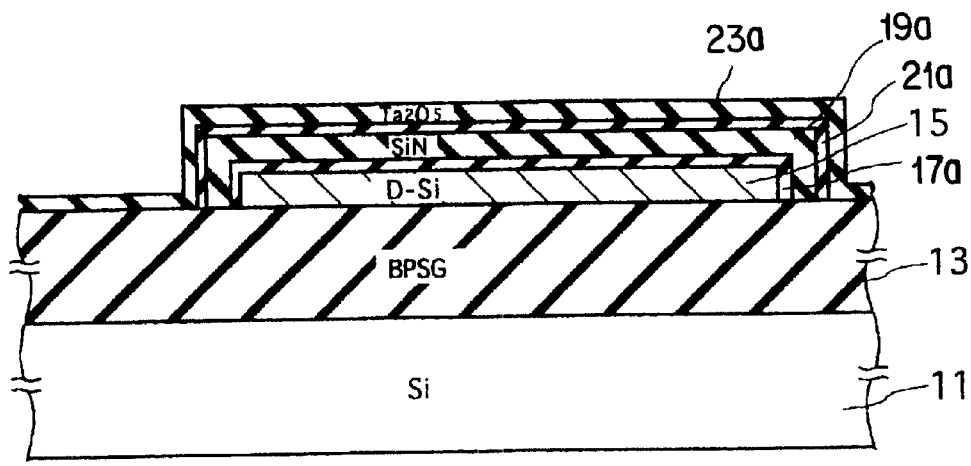
FIGS. 4A and 4B are diagrams for explaining manufacturing process of the capacitor shown in FIG. 1.
Figure 4B:
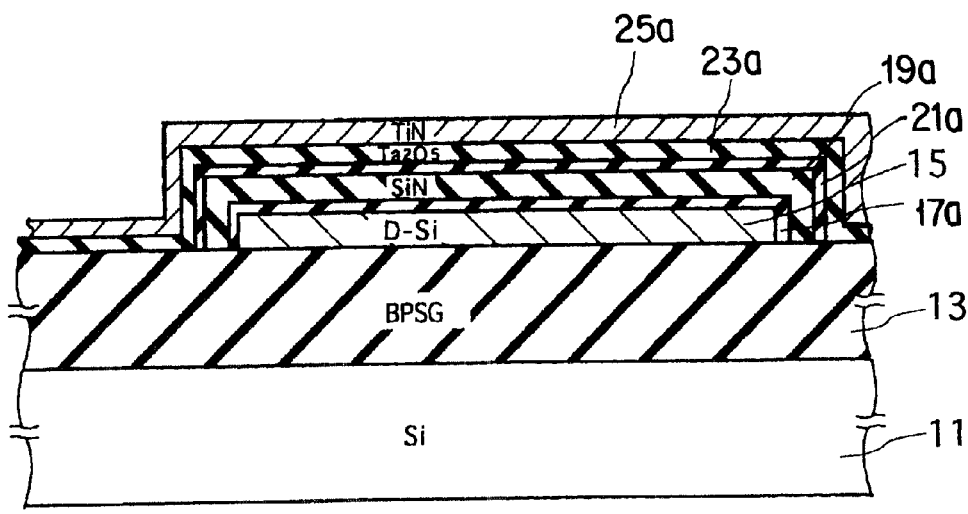

The unloaded wafers W are transported to, for example, a sputtering apparatus to deposit a TiN film 25a onto each of the wafers W as shown in FIG. 4B. The thickness of the deposited TiN film 25a may be approximately 100 nm.

Figure 5A:
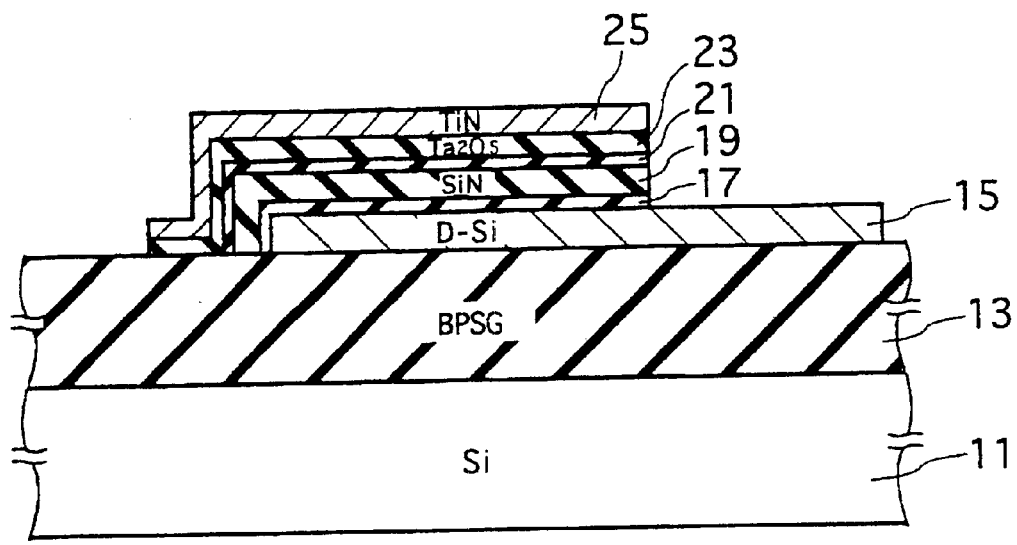
FIGS. 5A and 5B are diagrams for explaining manufacturing process of the capacitor shown in FIG. 1.

Then, the TiN film 25a, the tantalum oxide film 23a, the silicon oxide film 21a, the silicon nitride film 19a, and the silicon oxide film 17a are patterned in order, thus the structure shown in FIG. 5A is formed.

Figure 5B:
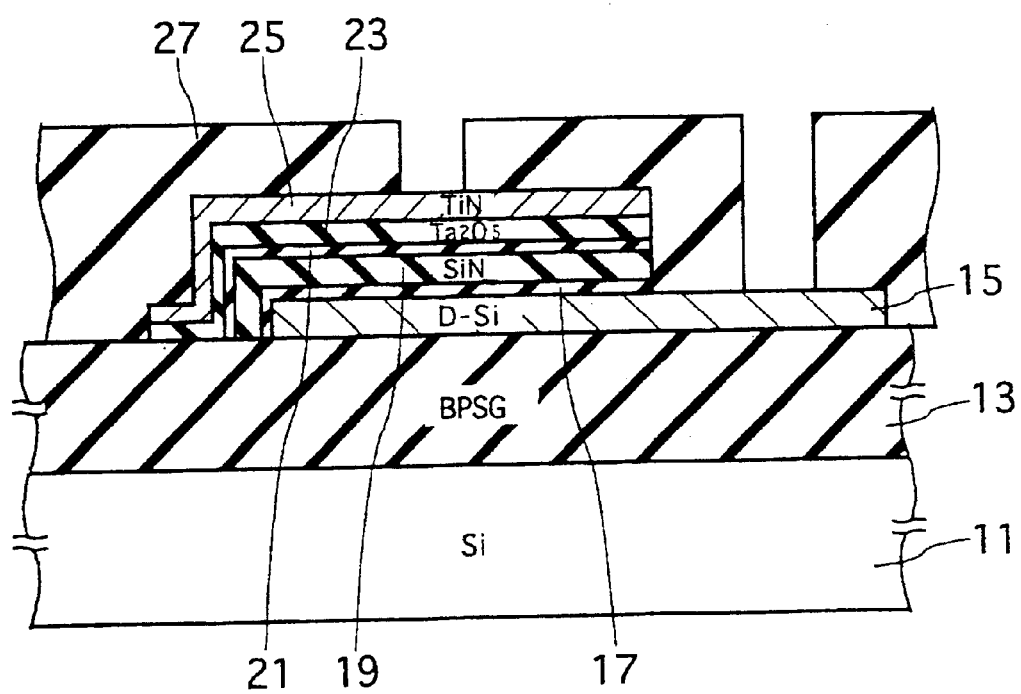

$SiO_2$ is deposited onto the whole surface of the wafer W, thus the second interlayer film 27 is formed. Then, contact holes are formed in the second interlayer film 27 as shown in FIG. 5B. Finally, the lead electrodes 29 and 31 are formed, thus the semiconductor capacitor for the analog circuit having the structure shown in FIG. 1 is completed.

According to the above described structure, since the dielectric film 23 made of tantalum oxide having a high dielectric constant is formed between the upper electrode 25 and the lower electrode 15, available capacitance is larger than that available by the conventional capacitor for an analog circuit having the same element size.

Further, since the total effective thickness of the oxide film between the lower electrode 15 and the dielectric film 23 is set to equal to or greater than 2 nm, a leak current is prevented from flowing, thus, excellent high voltage resistance is available.

EXAMPLE

An example of the present invention will now be described.

Figure 8:
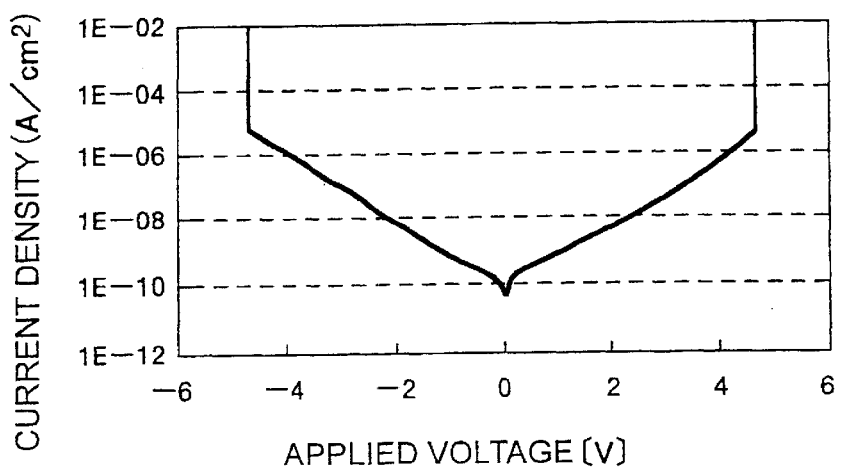
FIG. 8 is a graph showing the relationship between a voltage to be applied to the capacitor formed under dry oxidation and leak current density.

FIG. 8 is a graph showing high voltage characteristics of a capacitor in which the silicon nitride film 19a is formed in a thickness of 1.5 nm and the tantalum oxide film 23a in a thickness of 30 nm formed on the silicon nitride film 19a, and those are subjected to dry oxidation under oxygen atmosphere with no moisture during the manufacturing process.

As shown in FIG. 8, the density of an electric current (leak current) between the lower electrode 15 and the upper electrode 25 radically increases when the voltage of approximately +5 V or −5 V is applied to the upper electrode 25 while the reference voltage is set to a voltage at the lower electrode 15.

In other words, puncture occurs when equal to or greater than +5 V or −5 V is applied between the lower electrode 15 and the upper electrode 25, thus the capacitor breaks down. That is, the capacitor is not durable for analog circuit usage because its high voltage resistance is too low.

Figure 9:
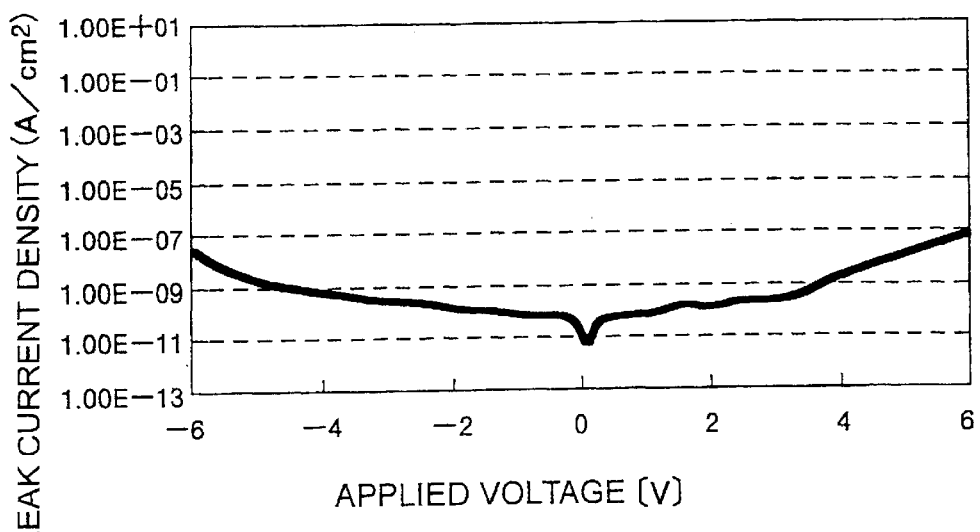
FIG. 9 is a graph showing the relationship between a voltage to be applied to the capacitor formed under wet oxidation and leak current density.

FIG. 9 is a graph showing high voltage characteristics of a capacitor having a nitride film 19 having a thickness of 1.5 nm and a dielectric film 23 having a thickness of 30 nm wherein those are formed by wet oxidation during the manufacturing process.

As shown in FIG. 9, a radical increase of current density does not appear even if voltages in a range of −6 V to 6 V are applied to the upper electrode 25 while the reference voltage is set to a voltage at the lower electrode 15, therefore, puncture does not occur. Moreover, the leak current density is very small (maximum leak current density: $1\times10^{-7}$ $A/cm^2$). That is, the capacitor is suitable for analog circuit usage because it has excellent high voltage resistance.

A relationship between leak current and the thickness of the dielectric film 23 and the effective thickness of the oxide film was investigated. For the investigation, six different capacitors being categorized in two groups were prepared. The first group includes first to third capacitors S1 to S3 each having a $Ta_2O_5$ film whose thickness is 30 nm. Those capacitors were formed under wet oxidization with different conditions for each. The second group includes fourth to sixth capacitors S4 to S6 each having a $Ta_2O_5$ film whose thickness is 40 nm. The capacitors of the second group were also formed under wet oxidization with the same conditions as those applied to the first group.

An experiment for finding a voltage Vc between the lower electrode 15 and the upper electrode 25 in each of those six capacitors S1 to S6 when leak current density is $1\times10^{-8}$ $A/cm^2$ was carried out.

Figure 10:
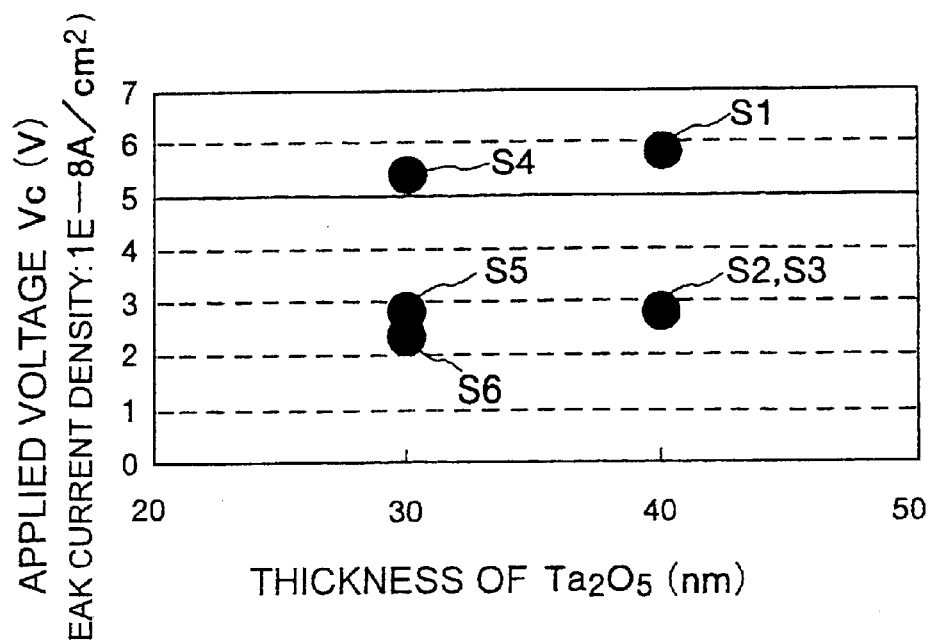
FIG. 10 is a diagram showing the relationship between the thickness of a dielectric film and leak current density.

FIG. 10 is shows the result of the experiment. It is obvious from FIG. 10 that the voltage Vc does not depend on the thickness of the $Ta_2O_5$ film (30 nm or 40 nm) under the same condition for wet oxidation. In other words, the thickness of the dielectric film 23 does not influence greatly high voltage characteristics or leak current characteristics.

Then, the effective thickness of the oxide film $To_{eff}$ in each of the capacitors S1 to S6 was obtained. The effective thickness of the oxide film $To_{eff}$ was calculated based on the capacitance between the upper electrode 25 and the lower electrode 15 and the thickness of the dielectric film 23. That is, the effective thickness of the oxide film $To_{eff}$ corresponds to the sum of the thickness of the oxide films 17, 21 and the converted thickness of a virtual oxide film based on the thickness of the nitride film 19 (the thickness of the silicon oxide film having the same high voltage resistance).

Figure 11:
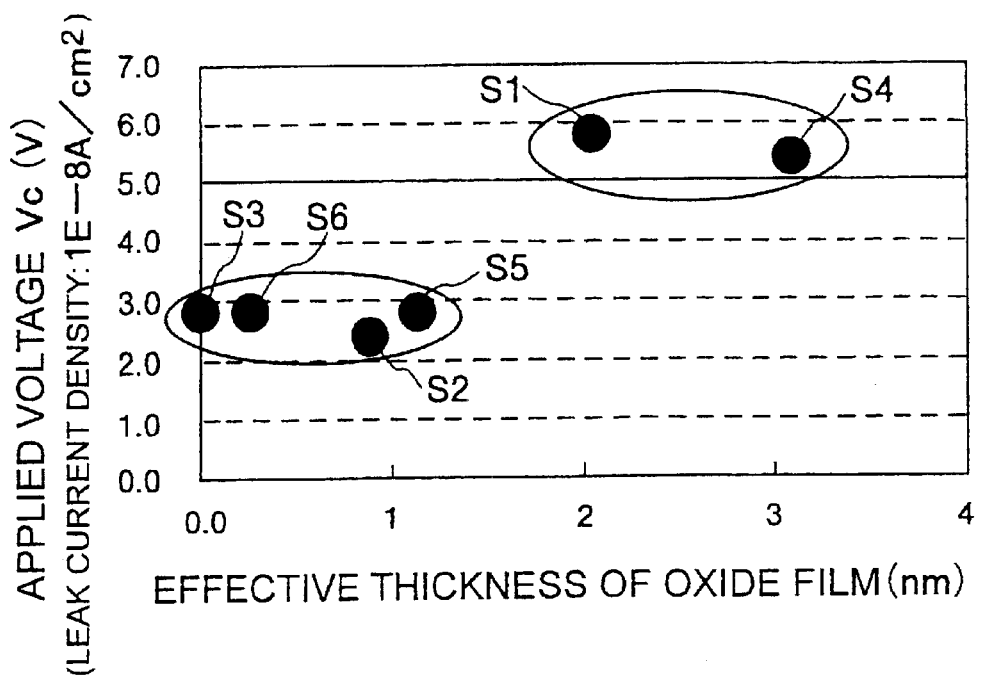
FIG. 11 is a diagram showing the relationship between the effective thickness of an oxide film and leak current density.

FIG. 11 shows the relationship between the effective thickness of the oxide film and the voltage Vc when the leak current density is $1\times10^{-8}$ $A/cm^2$. It is obvious from FIG. 11 that the voltage Vc exceeds 5 V when the effective thickness $To_{eff}$ of the oxide film (silicon oxide film) is equal to or greater than 2 nm, regardless of the thickness of the dielectric film 23. However, the voltage Vc shows only approximately 3 V when the thickness of the silicon oxide film is smaller than 2 nm. This is an unsuitable characteristic for the analog circuit usage.

According to FIGS. 10 and 11, a capacitor for the analog circuit requires a silicon oxide film having an effective thickness of at least 2 nm or more, depending on the thickness of the dielectric film 23.

The above description of the example also reveals that steps of forming a dielectric film and wet oxidation in order to form an oxide film having an effective thickness of 2 nm or thicker can provide a large capacitance capacitor having excellent high voltage resistance which is suitable for an analog circuit.

Various modifications or embodiments other than the above are applicable to the present invention.

For example, the above described embodiment may employ a combination of single wafer processing and batch processing. More precisely, the single wafer processing may be applicable to formation of the nitride film and oxidation process, while batch processing may be applicable to formation of the dielectric film. Or, single wafer processing and batch processing may be applicable to whole processing.

In the above described embodiment, the wet oxidation apparatus 71 performs both the crystallization process and the wet oxidation process for the tantalum oxide film. Instead of the wet oxidization apparatus 71, the metal oxide film forming apparatus 61 may carry out only the tantalum oxide film formation process with the signal wafer processing, and the wet oxidization apparatus 71 may perform the wet oxidization process, and modification and crystallization process for the tantalum oxide film with the batch processing.

It is preferable that the oxide film 17 is formed completely between the nitride film 19 and the lower electrode 15 in order to improve the high voltage characteristics between the upper electrode 25 and the lower electrode 15. A case where the oxide film 17 is formed partially may be applicable. It may be a case, for example, where the nitride film 19 has enough high voltage characteristics. In this case, the surface of the lower electrode 15 may be oxidized through weakened regions of the nitride film 19 (such as cracks or thinner regions). Even if the nitride film 19 has such regions where the high voltage resistance is weak, the partially formed oxide film 17 compensates for those regions. As a result, it shows desired high voltage resistance with reducing leak currents.

The above described embodiment employs a wet oxidating technique for oxidation. The present invention may employ other oxidation techniques by which the desired result is available. For example, the following conditions may be applicable: nitrous oxide ($N_2O$) atmosphere; approx. 500 to 800 degrees Celsius heat treatment for the capacitor element in which the dielectric film has been formed; and oxidation for 10 to 60 minutes. Ozone ($O_3$) or nitrogen monoxide (NO) atmosphere or the like may be applicable. However, a resultant capacitor manufactured under the above conditions may have larger leak current and poorer high voltage characteristics than a capacitor manufactured by wet oxidating. Accordingly, wet oxidation is the most suitable way for manufacturing a capacitor which shows desired performance.

Instead of the structure of the capacitor shown in FIG. 1, for example, the upper electrode 25 may be a metal electrode made of aluminum, copper, tungsten, or the like. If such a material is employed, however, the capacitor should be equipped with a barrier metal between the dielectric film 23 and the upper electrode 25.

Instead of tantalum oxide, the dielectric film 23 may employ BST (Barium Oxide, Strontium Oxide, Titanium Oxide Alloy), or the like.

Instead of Rapid Thermal Nitridation (RTN) for forming the silicon nitiride film 19a, the following step may be applicable. For example, thermal or plasma CVD may be carried out to deposit silicon nitride onto the structure shown in FIG. 2B to form the nitride film. Further, a combination of CVD and thermal nitridation may be applicable. Generally, thermal nitridation is advantageous over CVD in formation of a high quality nitride film having higher density. Accordingly, thermal nitridation is suitable for a case where a capacitor having better high voltage characteristics and a smaller leak current is required.

Instead of the batch processing, the nitride film may be formed by single wafer processing.

The following steps may also be applicable to form the structure of the capacitor shown in FIG. 1. For example, a $SiO_2$ film is formed on the surface of the lower electrode 15 by Rapid Thermal Oxidization (RTO) or deposition by CVD. And then, RTN or CVD is carried out to form a nitride film (or an oxynitride film), and formations of a $SiO_2$ film and a dielectric film may follow. However, this method requires more steps than the above indicated embodiment, therefore, manufacturing efficiency is not good. Moreover, the resultant capacitor shows larger leak current and slightly poorer high voltage characteristics than the case where the wet oxidation is employed. Accordingly, the method described in the above embodiment is preferable.

What is claimed is:

1. A method for manufacturing a capacitor for an analog circuit comprising:
    forming a semiconductor layer to be a first electrode;
    forming a dielectric film on said semiconductor layer;
    oxidizing said semiconductor layer via said dielectric film to form an oxide film between said semiconductor layer and said dielectric film; and
    forming a second electrode on said dielectric film so as to face said first electrode.

2. The method according to claim 1, wherein:
    said forming said first electrode includes forming a silicon layer in which impurities are doped; and
    said forming said oxide film includes heating an element under an oxidizing atmosphere to oxidize said semiconductor layer through said dielectric film, to form a silicon oxide film between said semiconductor layer and said dielectric layer.

3. The method according to claim 1, further comprising forming a nitride film on a surface of said semiconductor layer after forming said first electrode and before forming said dielectric film, wherein:
    forming said oxide film forms an oxide film between said nitride film and said dielectric film.

4. The method according to claim 3, wherein forming said oxide film includes oxidizing said semiconductor layer through said dielectric film and said nitride film to form a first oxide film between said nitride film and said dielectric film, and oxidizing a surface of said nitride film through said dielectric film to form a second oxide film between said nitride film and said semiconductor layer.

5. The method according to claim 3, wherein forming said oxide film includes oxidizing said nitride film to modify said nitride film to an oxynitride film or an oxide film at least partially.

6. The method according to claim 3, wherein forming said nitride film includes heating the surface of said semiconductor layer rapidly under nitridating atmosphere to nitrify the surface of said semiconductor layer.

7. The method according to claim 1, wherein forming said oxide film includes heating said semiconductor layer in a highly oxidizing atmosphere.

8. The method according to claim 1, wherein forming said oxide film includes wet oxidation.

9. The method according to claim 1, wherein forming said oxide film includes supplying oxygen to said dielectric film while heating said dielectric film to recrystallize said dielectric film.

10. The method according to claim 1, wherein forming said oxide film includes forming an oxide film whose effective thickness is equal to or greater than 2 nm.

11. The method according to claim 1, wherein forming said dielectric film includes forming a tantalum oxide film having a thickness in a range of 15 to 60 nm.

12. A capacitor for an analog circuit comprising:

a first electrode made of a semiconductor layer;

a first oxide film formed on said first electrode;

a nitride film formed on said first oxide film;

a second oxide film formed on said nitride film;

a dielectric film formed on said second oxide film; and a second electrode formed on said dielectric film so as to face said first electrode, wherein said dielectric film has a dielectric constant of a value higher than a dielectric constant of said nitride film.

13. The capacitor according to claim 12, wherein:

said first electrode is made of silicon, said first and second oxide films are made of silicon oxide, and said nitride film is made of silicon nitride.

14. The capacitor according to claim 12, wherein said nitride film is partially oxidized.

15. The capacitor according to claim 12 wherein the sum of the thicknesses of said first and second oxide films and the thickness of a virtual silicon oxide film whose dielectric strength is the same as the dielectric strength of said nitride film is equal to or greater than 2 nm.

16. A capacitor for an analog circuit comprising:

a first electrode made of a semiconductor layer;

a first oxide film formed on said first electrode;

a nitride film formed on said first oxide film;

a second oxide film formed on said nitride film;

a dielectric film formed on said second oxide; and a second electrode formed on said dielectric film so as to face said first electrode, wherein the sum of the thicknesses of said first and second oxide films and the thickness of a virtual silicon oxide film whose dielectric strength is the same as the dielectric strength of said nitride film is equal to or greater than 2 nm, and is half the thickness of said dielectric film or less.

17. The capacitor according to claim 12, wherein said dielectric film comprises a tantalum oxide film whose thickness is 15 to 60 nm.

* * * * *